US012791624B2

(12) United States Patent
Kubotani et al.

(10) Patent No.: US 12,791,624 B2
(45) Date of Patent: Nov. 10, 2026

(54) STORAGE BATTERY MANAGEMENT DEVICE, STORAGE BATTERY SYSTEM, AND STORAGE BATTERY MANAGEMENT METHOD

(71) Applicant: KYOCERA CORPORATION, Kyoto (JP)

(72) Inventors: Tsuyoshi Kubotani, Osaka (JP); Yuya Ishida, Daito (JP); Masanobu Sato, Yasu (JP); Yuki Oda, Osaka (JP); Takaaki Fukushima, Moriyama (JP)

(73) Assignee: KYOCERA CORPORATION, Kyoto (JP)

( * ) Notice: Subject to any disclaimer, the term of this patent is extended or adjusted under 35 U.S.C. 154(b) by 168 days.

(21) Appl. No.: 18/730,786

(22) PCT Filed: Jan. 28, 2022

(86) PCT No.: PCT/JP2022/003423
§ 371 (c)(1),
(2) Date: Jul. 22, 2024

(87) PCT Pub. No.: WO2023/145024
PCT Pub. Date: Aug. 3, 2023

(65) Prior Publication Data
US 2025/0102591 A1 Mar. 27, 2025

(51) Int. Cl.

| | |
|---|---|
| ***G01R 31/392*** | (2019.01) |
| ***G01R 31/374*** | (2019.01) |
| ***H01M 10/42*** | (2006.01) |
| ***H01M 10/48*** | (2006.01) |

(52) U.S. Cl.
CPC ......... *G01R 31/392* (2019.01); *G01R 31/374* (2019.01); *H01M 10/425* (2013.01); *H01M 10/486* (2013.01); *H01M 2010/4271* (2013.01)

(58) Field of Classification Search
CPC . G01R 31/392; G01R 31/3842; G01R 31/389
See application file for complete search history.

(56) References Cited

U.S. PATENT DOCUMENTS

2015/0355288 A1* 12/2015 Yokoyama ........... G01R 31/389 702/63
2016/0209472 A1* 7/2016 Chow .................. B60K 35/215
2016/0375790 A1* 12/2016 Komiyama ............. B60L 58/12 320/136

(Continued)

FOREIGN PATENT DOCUMENTS

WO 2021085433 A1 5/2021

*Primary Examiner* — Giovanni Astacio-Oquendo
*Assistant Examiner* — Temilade S Rhodes-Vivour
(74) *Attorney, Agent, or Firm* — HAUPTMAN HAM, LLP

(57) ABSTRACT

A storage battery management device includes a controller. The controller is configured to acquire a current value flowing in a storage battery, a temperature of the storage battery, and a charge level of the storage battery in a target period, determine an operation mode of the storage battery in the target period based on the current value and the charge level, and estimate a degree of degradation of the storage battery in the target period based on the operation mode and the temperature. The target period is divided by switching of operating states of the storage battery including charging, discharging, and retaining.

8 Claims, 7 Drawing Sheets

(56) References Cited

U.S. PATENT DOCUMENTS

| | | | | |
|---|---|---|---|---|
| 2017/0146609 | A1* | 5/2017 | Uchino ............... | H01M 10/486 |
| 2018/0006335 | A1* | 1/2018 | Fujita .................. | H01M 10/425 |
| 2018/0131200 | A1* | 5/2018 | Crawford ............. | G01R 31/367 |
| 2021/0178927 | A1 | 6/2021 | Yamamoto et al. | |
| 2022/0390523 | A1 | 12/2022 | Kubotani et al. | |

* cited by examiner

FIG. 5

| TIME | OPERATING STATE | APPLICABLE OPERATION MODE | SOC RANGE [%] | APPLICABLE CATEGORY | | |
|---|---|---|---|---|---|---|
| | | | | NORMAL DEGRADATION | RATE-DEPENDENT DEGRADATION | RETENTION DEGRADATION |
| $t_1$ | DISCHARGING | OPERATION MODE 2 | 40~100 | ○ | | |
| $t_2$ | RETAINING | OPERATION MODE 9 | 30~70 | | | ○ |
| $t_3$ | DISCHARGING | OPERATION MODE 6 | 0~90 | ○ | | |
| $t_4$ | RETAINING | OPERATION MODE 10 | 5~30 | | | ○ |
| $t_5$ | CHARGING | OPERATION MODE 1 | 10~100 | ○ | ○ | |
| $t_6$ | DISCHARGING | OPERATION MODE 2 | 40~100 | ○ | | |
| ⋮ | ⋮ | ⋮ | ⋮ | ⋮ | ⋮ | ⋮ |
| $t_k$ | CHARGING | OPERATION MODE 2 | 40~100 | ○ | ○ | |

FIG. 6

(OPERATING MODES)

| | OPERATION MODE 1 | OPERATION MODE 2 | OPERATION MODE 3 | OPERATION MODE 4 | OPERATION MODE 5 | OPERATION MODE 6 |
|---|---|---|---|---|---|---|
| SOC RANGE [%] | 10-100 | 40-100 | 70-100 | 40-90 | 0-40 | 0-90 |
| DEGRADATION INDEX β | 0. 38 | 0. 38 | 0. 38 | 0. 38 | 0. 38 | 0. 38 |
| SLOPE b | -3280. 72 | -3280. 72 | -3280. 72 | -3280. 72 | -3280. 72 | -3280. 72 |
| INTERCEPT c | 10. 34995 | 9. 981535 | 9. 889431 | 9. 428914 | 8. 738139 | 9. 428914 |

(RETAINING MODES)

| | OPERATION MODE 7 | OPERATION MODE 8 | OPERATION MODE 9 | OPERATION MODE 10 | OPERATION MODE 11 |
|---|---|---|---|---|---|
| SOC RANGE [%] | 95-100 | 70-95 | 30-70 | 5-30 | 0-5 |
| DEGRADATION INDEX β | 0. 38 | 0. 42 | 0. 46 | 0. 5 | 0. 5 |
| SLOPE b | -4741. 22 | -4741. 22 | -4741. 22 | -4741. 22 | -4741. 22 |
| INTERCEPT c | 14. 3305 | 13. 8054 | 13. 0177 | 12. 23 | 12. 23 |

FIG. 7

| | | OPERATION MODE 1 | OPERATION MODE 2 | OPERATION MODE 3 | OPERATION MODE 4 | OPERATION MODE 5 | OPERATION MODE 6 |
|---|---|---|---|---|---|---|---|
| SOC RANGE [%] | | 10-100 | 40-100 | 70-100 | 40-90 | 0-40 | 0-90 |
| CAPACITY PER CYCLE | | RATED × $0.93^2$ | RATED × $0.6^2$ | RATED × $0.3^2$ | RATED × $0.3^2$ | RATED × $0.33^2$ | RATED × $0.63^2$ |
| TEMPERATURE | -22°C~-18°C | $(\alpha_{11}, \beta_{11})$ | $(\alpha_{21}, \beta_{21})$ | $(\alpha_{31}, \beta_{31})$ | $(\alpha_{41}, \beta_{41})$ | $(\alpha_{51}, \beta_{51})$ | $(\alpha_{61}, \beta_{61})$ |
| | -17°C~-13°C | $(\alpha_{12}, \beta_{12})$ | $(\alpha_{22}, \beta_{22})$ | $(\alpha_{32}, \beta_{32})$ | $(\alpha_{42}, \beta_{42})$ | $(\alpha_{52}, \beta_{52})$ | $(\alpha_{62}, \beta_{62})$ |
| | ⋮ | ⋮ | ⋮ | ⋮ | ⋮ | ⋮ | ⋮ |
| | 28°C~32°C | $(\alpha_{1n-1}, \beta_{1n-1})$ | $(\alpha_{2n-1}, \beta_{2n-1})$ | $(\alpha_{3n-1}, \beta_{3n-1})$ | $(\alpha_{4n-1}, \beta_{4n-1})$ | $(\alpha_{5n-1}, \beta_{5n-1})$ | $(\alpha_{6n-1}, \beta_{6n-1})$ |
| | 33°C~37°C | $(\alpha_{1n}, \beta_{1n})$ | $(\alpha_{2n}, \beta_{2n})$ | $(\alpha_{3n}, \beta_{3n})$ | $(\alpha_{4n}, \beta_{4n})$ | $(\alpha_{5n}, \beta_{5n})$ | $(\alpha_{6n}, \beta_{6n})$ |

STORAGE BATTERY MANAGEMENT DEVICE, STORAGE BATTERY SYSTEM, AND STORAGE BATTERY MANAGEMENT METHOD

The present application is a National Phase of International Application Number PCT/JP2022/003423 filed Jan. 28, 2022.

TECHNICAL FIELD

The present disclosure relates to a storage battery management device, a storage battery system, and a storage battery management method.

BACKGROUND OF INVENTION

Heretofore, technologies for measuring the degree of degradation (SOH (state of health)), which is an indicator of the state of degradation of storage batteries, in order to manage storage batteries have been disclosed. For example, in a known technology, a storage battery is allowed to fully discharge after being fully charged, and the degree of degradation of the storage battery is measured from the amount of power discharged during that period. However, measuring the degree of degradation of a storage battery by completely discharging the storage battery generally requires the storage battery to be operated in a dedicated operation state, and use of the storage battery is restricted while the degree of degradation of the storage battery is being measured. For example, Patent Literature 1 discloses a technology in which the degree of degradation of a storage battery is estimated based on information acquired without operating the battery in a dedicated operation state.

CITATION LIST

Patent Literature

Patent Literature 1: International Publication No. 2021/085433

SUMMARY

Problem to be Solved

Further improvements are needed in the accuracy with which the degree of degradation of storage batteries is estimated.

In light of these circumstances, the present disclosure provides a storage battery management device, a storage battery system, and a storage battery management method that can estimate the degree of degradation of a storage battery with high accuracy.

Solution to Problem

In an embodiment of the present disclosure, a storage battery management device includes a controller.

The controller is configured to acquire a current value flowing in a storage battery, a temperature of the storage battery, and a charge level of the storage battery in a target period, determine an operation mode of the storage battery in the target period based on the current value and the charge level, and estimate a degree of degradation of the storage battery in the target period based on the operation mode and the temperature.

The target period is divided by switching of operating states of the storage battery including charging, discharging, and retaining.

In an embodiment of the present disclosure, a storage battery system includes a storage battery and a storage battery management device.

The storage battery management device includes a controller.

The controller is configured to acquire a current value flowing in the storage battery, a temperature of the storage battery, and a charge level of the storage battery in a target period, determine an operation mode of the storage battery in the target period based on the current value and the charge level, and estimate a degree of degradation of the storage battery in the target period based on the operation mode and the temperature.

The target period is divided by switching of operating states of the storage battery including charging, discharging, and retaining.

In an embodiment of the present disclosure, a storage battery management method is to be performed by a storage battery management device including a controller.

The method includes the controller acquiring a current value flowing in the storage battery, a temperature of the storage battery, and a charge level of the storage battery in a target period;

determining an operation mode of the storage battery in the target period based on the current value and the charge level; and estimating a degree of degradation of the storage battery in the target period based on the operation mode and the temperature.

The target period is divided by switching of operating states of the storage battery including charging, discharging, and retaining.

Advantageous Effect

According to the present disclosure, a storage battery management device, a storage battery system, and a storage battery management method that can estimate the degree of degradation of a storage battery with high accuracy can be provided.

BRIEF DESCRIPTION OF THE DRAWINGS

FIG. 5 is a diagram illustrating examples of operation modes determined in accordance with changes in the charge level in FIG. 4.

FIG. 6 is a diagram illustrating example configurations of multiple operation modes.

FIG. 7 illustrates an example table of coefficients and so forth for determining amounts of change with temperature caused by rate-dependent degradation.

DESCRIPTION OF EMBODIMENTS

Figure 1:
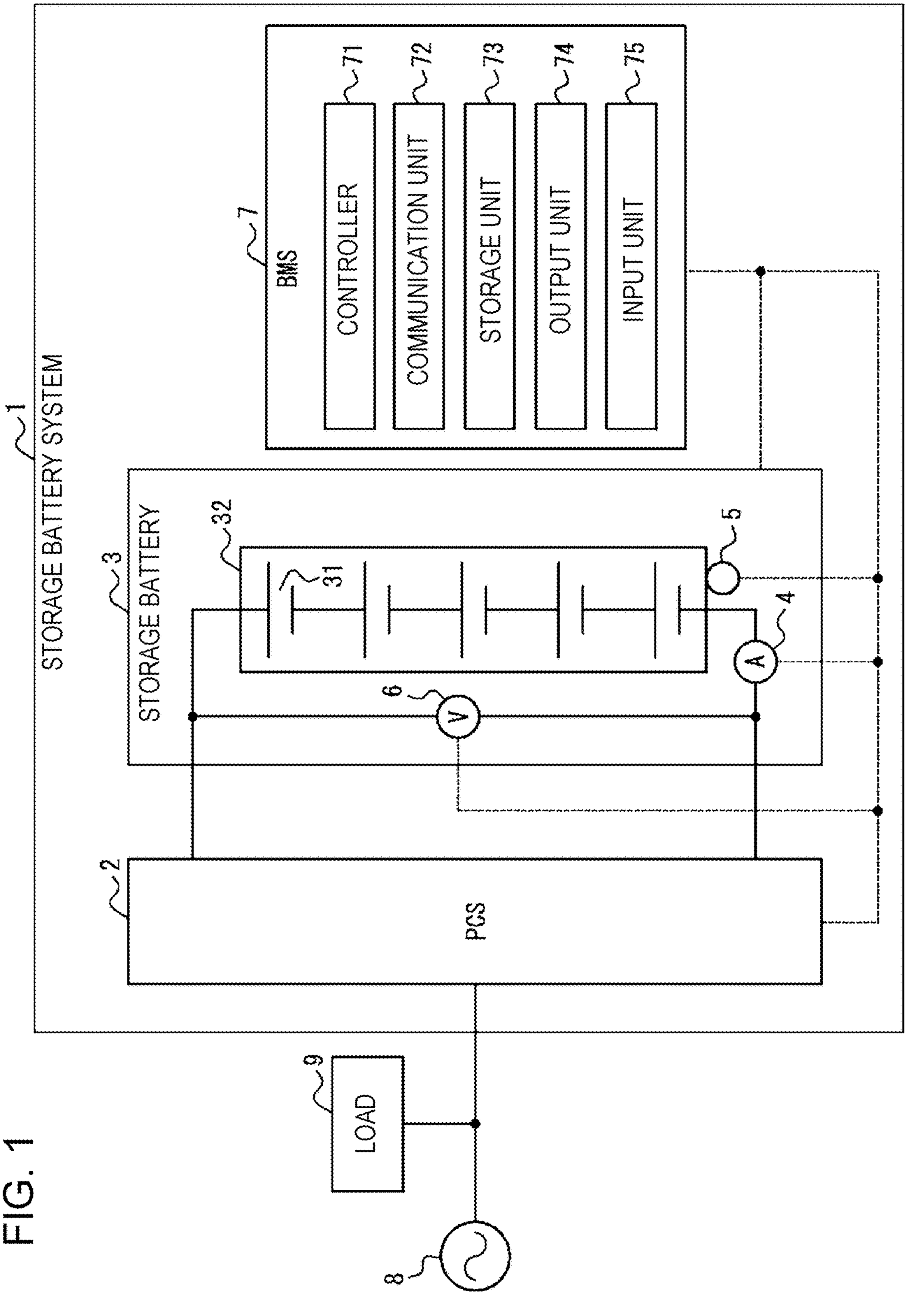
FIG. 1 is a schematic configuration diagram of a storage battery system according to an embodiment of the present disclosure.

Hereafter, in an embodiment of the present disclosure, a storage battery management device, a storage battery system, and a storage battery management method are described while referring to the drawings.

In the drawings, identical same symbols denote identical or equivalent parts. In the description of this embodiment, the description of identical or equivalent parts is omitted or simplified as appropriate.

(Configuration of Storage Battery System)

FIG. 1 is a schematic configuration diagram illustrating an example of a storage battery system 1 according to an embodiment of the present disclosure. The storage battery system 1 includes a power conditioner 2, a storage battery 3, a current sensor 4, a temperature sensor 5, a voltage sensor 6, and a storage battery management device 7. The power conditioner 2 is also called a PCS (power conditioning system). The storage battery management device 7 is also called a BMS (battery management system). In the storage battery system 1, the storage battery 3 is connected to outside the storage battery system 1, such as to a power system 8 and a load 9, via the power conditioner 2. Thus, the storage battery system 1 can supply power charged to the storage battery 3 to the power system 8 and the load 9, etc. The storage battery system 1 can also charge the storage battery 3 with power supplied from the power system 8 or another source.

As represented by dashed lines in FIG. 1, the power conditioner 2, the storage battery 3, the current sensor 4, the temperature sensor 5, the voltage sensor 6, and the storage battery management device 7 are connected to each other in a wired or wireless manner via a network such as CAN (controller area network). In this embodiment, as illustrated in FIG. 1, the storage battery system 1 is described as including one of each of the power conditioner 2, the storage battery 3, the current sensor 4, the temperature sensor 5, the voltage sensor 6, and the storage battery management device 7, but the storage battery system 1 may include any number of each of these components.

The power conditioner 2 converts DC power to be discharged to the outside from the storage battery 3 into AC power. The power conditioner 2 converts AC power to be supplied to the storage battery 3 from the outside into DC power.

The storage battery 3 is a chargeable/dischargeable battery such as a lithium-ion battery. The storage battery 3 includes a storage battery module 32 including one or more cells 31. The storage battery 3 can store power in the cells 31 of the storage battery module 32 and discharge power from the cells 31. In this embodiment, multiple cells 31 are described as being connected in series in the storage battery module 32, but the cells 31 may be connected in parallel with each other. In the storage battery 3, multiple storage battery modules 32 may be connected in series or parallel with each other.

The current sensor 4 measures a current value flowing in the storage battery 3. The current value flowing in the storage battery 3 includes at least one of a current value input to the storage battery 3 or a current value output from the storage battery 3. The current sensor 4 transmits the measured current value to the storage battery management device 7, for example, as the current value flowing in the storage battery 3. In this embodiment, the current sensor 4 is connected in series with one terminal of the storage battery module 32. However, the current sensor 4 is not limited to being connected to one terminal of the storage battery module 32, and may be connected to any position where the current value flowing in the storage battery 3 can be measured.

The temperature sensor 5 measures the temperature of the storage battery 3. The temperature sensor 5 transmits the measured temperature to the storage battery management device 7, for example, as the temperature of the storage battery 3. In this embodiment, the temperature sensor 5 is installed on an outer surface of one terminal of the storage battery module 32. However, the temperature sensor 5 is not limited to being installed on the outer surface of one terminal of the storage battery module 32, and may be installed at any position where the temperature of the storage battery 3 can be measured.

The voltage sensor 6 measures a voltage value of the storage battery 3. The voltage sensor 6 transmits the measured voltage value to the storage battery management device 7, for example, as the voltage value of the storage battery 3. Examples of the voltage value of the storage battery 3 include voltage values during charging and discharging and the value of the open circuit voltage when no current is flowing. In this embodiment, the voltage sensor 6 is connected in parallel with both terminals of the storage battery module 32. However, the voltage sensor 6 is not limited to being connected in parallel with both terminals of the storage battery module 32, and may be installed at any position where the voltage value of the storage battery 3 can be measured.

The storage battery management device 7 manages the storage battery 3. The storage battery management device 7 controls the storage battery 3 by, for example, turning the power on or off or transmitting information from the storage battery 3 to the storage battery management device 7.

In an embodiment of the present disclosure, in the storage battery system 1, the storage battery management device 7 communicates with the current sensor 4, the temperature sensor 5, and the voltage sensor 6, etc., and acquires the current value flowing in the storage battery 3, the temperature of the storage battery 3, and the charge level of the storage battery 3. The storage battery management device 7 determines an operation mode of the storage battery and estimates the degree of degradation based on the acquired current value, temperature, and charge level of the storage battery 3. Thus, the degree of degradation of the storage battery 3 can be estimated based on information acquired without operating the storage battery 3 in a dedicated operation state.

The degree of degradation of the storage battery 3 is expressed using SOH (state of health). SOH is the ratio (%) of the current full charge capacity (FCC) to the design capacity (DC). The design capacity may be, for example, the initial value of the full charge capacity of the storage battery 3 as determined by the manufacturer of the storage battery 3. The charge level of the storage battery 3 is expressed using SOC (states of charge). SOC is the ratio (%) of the present charge to the present full charge capacity.

In the present disclosure, an operation state of the storage battery 3 is also referred to as an operation mode in the following description. Operation modes of the storage battery 3 include, for example, operating modes, which are operation states in which the storage battery 3 is charging or discharging, and retaining modes, which are operation states in which the storage battery 3 retains power.

(Configuration of Storage Battery Management Device)

The schematic configuration of the storage battery management device 7 according to this embodiment will be described while referring to FIG. 1. As illustrated in FIG. 1, the storage battery management device 7 includes a controller 71, a communication unit 72, a storage unit 73, an output unit 74, and an input unit 75. The controller 71, the communication unit 72, the storage unit 73, the output unit 74, and the input unit 75 are connected to each other in a wired or wireless manner so as to be able to communicate with each other.

The controller 71 includes one or more processors. The processor may be a general-purpose processor such as a CPU (central processing unit) or a dedicated processor specialized for particular processing. The controller 71 is not limited to a processor and may include one or more dedicated circuits. A dedicated circuit may be, for example, a FPGA (field-programmable gate array) or an ASIC (application specific integrated circuit). The controller 71 controls the communication unit 72, the storage unit 73, the output unit 74, and the input unit 75, as described above, in order to realize the functions of the storage battery management device 7. Characteristic control in this embodiment performed by the controller 71 will be further described later.

The communication unit 72 includes one or more communication modules. The communication module is, for example, a CAN communication module, a wired LAN (local area network) communication module, or a wireless LAN communication module. In this embodiment, the storage battery management device 7 can communicate with the power conditioner 2, the storage battery 3, the current sensor 4, the temperature sensor 5, and the voltage sensor 6, etc. included in the storage battery system 1 via the communication unit 72.

The storage unit 73 may be a semiconductor memory, a magnetic memory, or an optical memory, for example. The storage unit 73 may be a cache memory of a processor included in the controller 71. The storage unit 73 may be a volatile storage device or a non-volatile storage device. The storage unit 73 stores system programs, application programs, embedded software, information, and so on for realizing the functions of the storage battery management device 7.

The output unit 74 outputs information in the form of images, sound, and so on. The output unit 74 includes an output device such as a display and a speaker.

The input unit 75 accepts input operations. The input unit 75 includes an input device such as a touch panel and a remote controller.

Example Processing of Storage Battery Management Device

Figure 2:
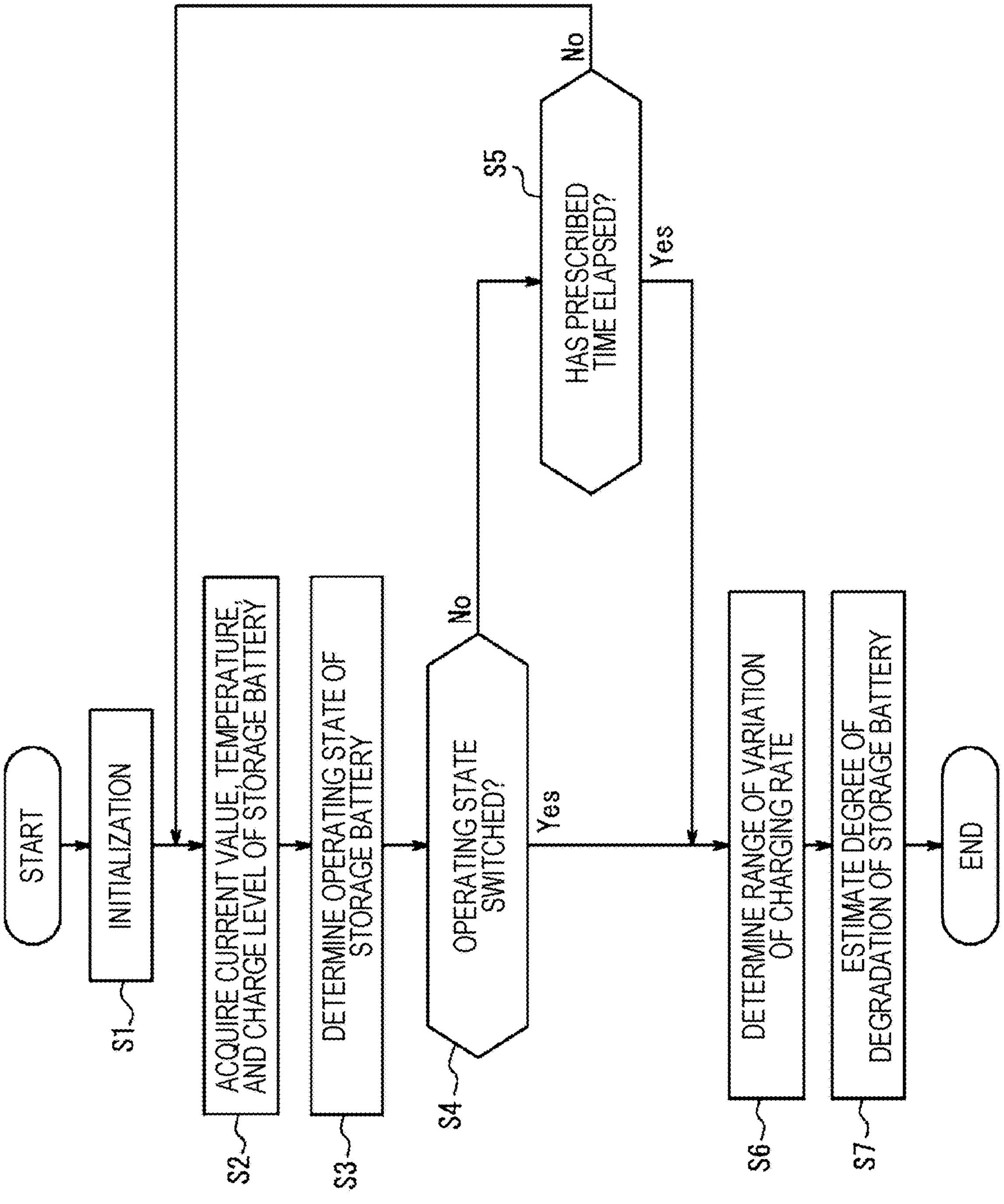
FIG. 2 is a flowchart of an example of processing of a storage battery management device illustrated in FIG. 1.
Figure 3:
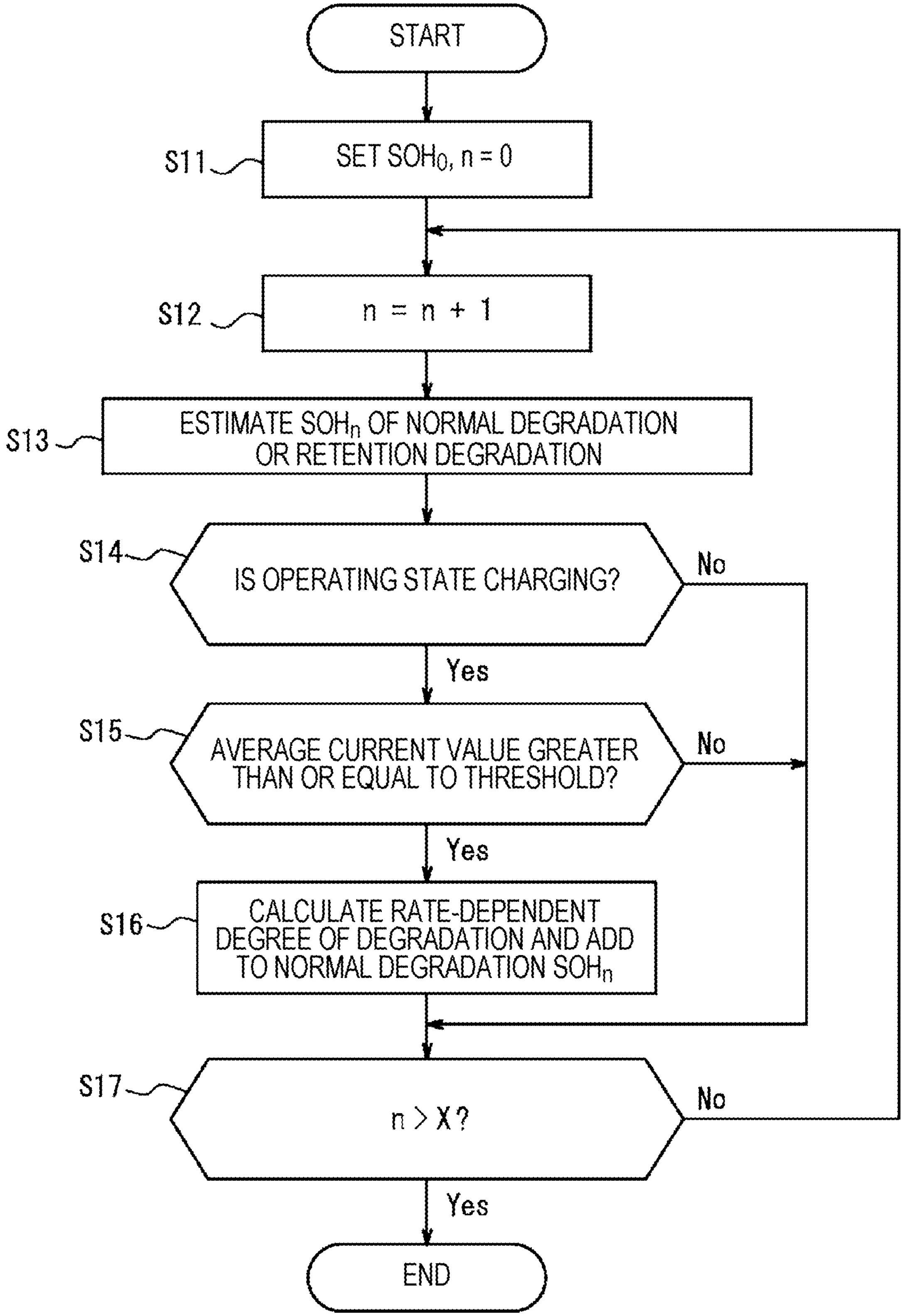
FIG. 3 is a flowchart detailing part of the processing illustrated in FIG. 2.

Referring to FIGS. 2 and 3, an example of processing for estimating the degree of degradation of the storage battery 3 (hereafter also referred to as "this processing"), which is performed by the storage battery management device 7 according to this embodiment, is described. This processing corresponds to a storage battery management method according to this embodiment. FIG. 2 illustrates a flowchart of an example of this processing performed by the storage battery management device 7. FIG. 3 illustrates a flowchart detailing part of the processing illustrated in FIG. 2.

Referring to FIG. 2, in Step S1, the controller 71 performs initialization necessary for this processing.

Specifically, the controller 71 acquires an initial value of the charge level of the storage battery 3 and an initial value of the degree of degradation stored in the storage unit 73. The initial value of the charge level and the initial value of the degree of degradation are values that are respectively considered to be the charge level and the degree of degradation of the storage battery 3 at the start of this processing. The initial value of the charge level and the initial value of the degree of degradation of the storage battery 3 are, for example, the charge level and the degree of degradation of the storage battery 3 calculated by processing the same as this processing performed previously. Here, the controller 71 may acquire the initial values using different processing from this processing. For example, the controller 71 may use, as the initial values, the actual measured charge level and the actual measured degree of degradation of the storage battery 3 measured by operating the storage battery 3 in a dedicated operation state.

The controller 71 stores the very first start date and time of a target period during which the estimation of the degree of degradation of the storage battery 3 is performed in this processing. Specifically, the controller 71 stores the date and time at which this processing is started in the storage unit 73. The target period during which the estimation of the degree of degradation of the storage battery 3 is performed in this processing is hereafter also referred to simply as the "target period".

In Step S2, the controller 71 acquires the current value flowing in the storage battery 3, the temperature of the storage battery 3, and the charge level of the storage battery 3.

Specifically, the controller 71 communicates with the current sensor 4 via the communication unit 72 and receives the current value measured by the current sensor 4 at intervals of one second, for example, as the current value flowing in the storage battery 3. The controller 71 communicates with the temperature sensor 5 via the communication unit 72 and receives the temperature measured by the temperature sensor 5 at intervals of one second, for example, as the temperature of the storage battery 3. Furthermore, the controller 71 calculates the charge level of the storage battery 3 based on the initial value of the charge level and the received current value flowing in the storage battery 3 by using a current integration method, for example. The controller 71 stores the current value, temperature, and charge level of the storage battery 3 in the storage unit 73 as information on the current value, temperature, and charge level of the storage battery 3 acquired in the target period.

The methods used by the controller 71 to acquire the current value flowing in the storage battery 3, the temperature of the storage battery 3, and the charge level of the storage battery 3 are not limited to the examples described above. For example, the controller 71 may communicate with the voltage sensor 6 and calculate the charge level of the storage battery 3 based on the value of the open circuit voltage of the storage battery 3.

In Step S3, the controller 71 determines whether the operation mode is an operating mode in which charging or discharging is performed or a retaining mode in which power is retained. In more detail, the controller 71 determines the operating state of the storage battery 3 based on at least one of the acquired current value or charge level, for example. The operating states include charging, discharging, and retaining. If the operating state of storage battery 3 is retaining, the controller 71 determines that the operation mode is a retaining mode. If the operating state of the storage battery 3 is charging or discharging, the controller 71 determines that the operation mode is an operating mode.

For example, the controller 71 may determine the operating state of the storage battery 3 by estimating changes in the storage battery 3 by reading and comparing the past current values, charge levels, etc. stored in the storage unit 73. For example, the controller 71 may determine that the storage battery 3 is being input with or is outputting a prescribed amount of power or more and the operation mode is an operating mode if the target period includes a current value whose absolute value is greater than or equal to a prescribed value. On the other hand, the controller 71 may determine that the storage battery 3 is retaining power and the operation mode is a retaining mode if the current values acquired over the target period do not include a current value whose absolute value is greater than or equal to the prescribed value.

Figure 4:
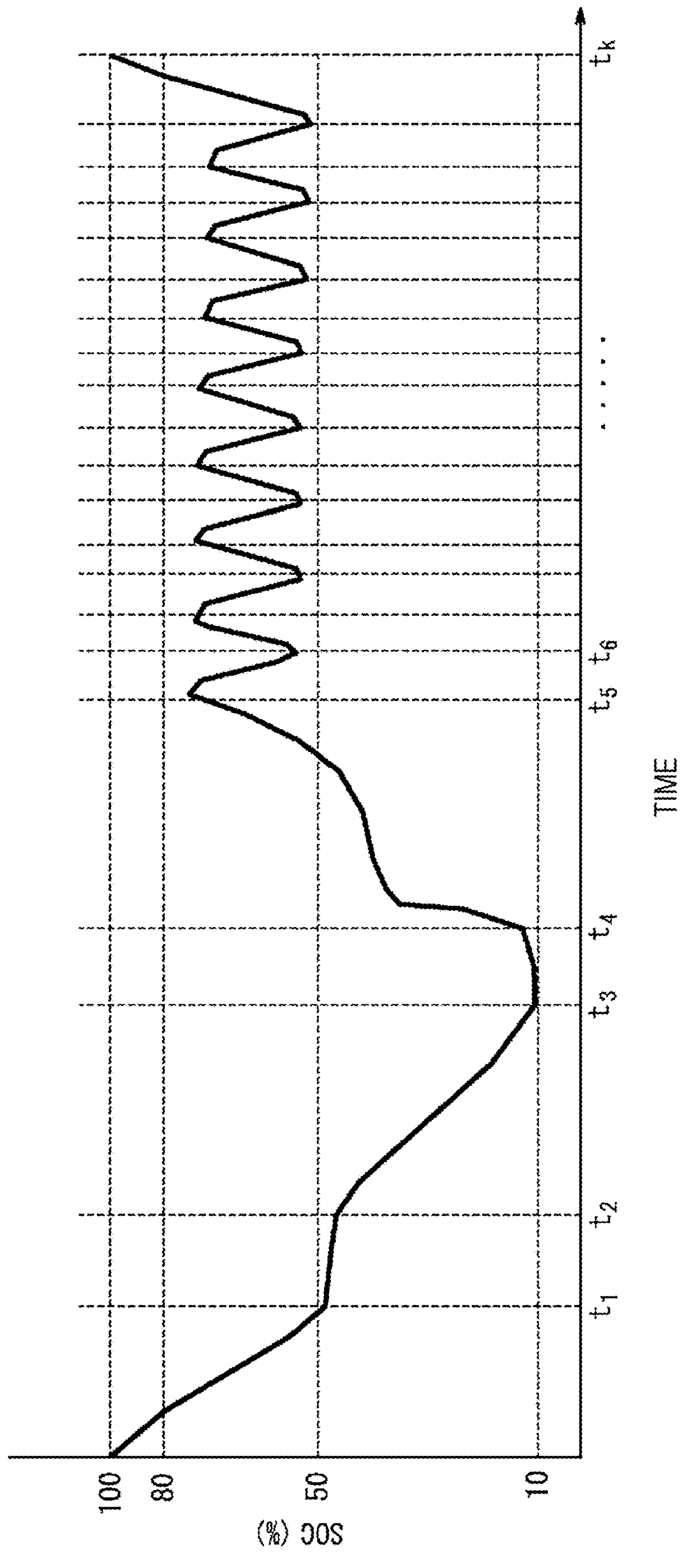
FIG. 4 is a diagram illustrating an example of changes that occur in the charge level of a storage battery over time.

FIG. 4 is a diagram illustrating an example of changes in the charge level of the storage battery 3 that occur over time. FIG. 5 is a diagram illustrating examples of operation modes determined in accordance with the changes in the charge level in FIG. 4. The vertical axis of FIG. 4 represents the charge level (SOC) of the storage battery 3. The horizontal axis of FIG. 4 represents time, and times $t_1$, $t_2$, $t_3$, $t_4$, $t_5$, $t_6$, . . . , and $t_k$ are illustrated. k is an integer greater than or equal to 7. The controller 71 acquires the charge level at timings including these times. For example, the controller 71 determines the operating state, as illustrated in FIG. 5, based on changes in the charge level of the storage battery 3 at the times $t_1$, $t_2$, $t_3$, $t_4$, $t_5$, $t_6$, . . . , and $t_k$. For example, at the time $t_1$ in FIG. 4, the charge level has dropped from 100% to around 50%, and the controller 71 determines that the operating state is discharging, as illustrated in FIG. 5. For example, at the time $t_2$ in FIG. 4, the charge level remains at around 50% and does not significantly change, and the controller 71 determines that the operating state is retaining, as illustrated in FIG. 5. For example, at the time $t_5$ in FIG. 4, the charge level has increased from 10% to around 80%, and the controller 71 determines that the operating state is charging, as illustrated in FIG. 5. In this way, the controller 71 determines the operating state of the storage battery 3 in a prescribed time. The prescribed time is set to include timings where changes are indicated in the charge level such as the times $t_1$, $t_2$, $t_3$, $t_4$, $t_5$, $t_6$, . . . , and $t_k$. The prescribed time is every 10 minutes, for example. The controller 71 stores the determined operating state of the storage battery 3 in the storage unit 73 in association with the time at which the determination was made. The "applicable operation mode", "SOC range", and "applicable category" in FIG. 5 are described below.

Referring again to FIG. 2, in Step S4, the controller 71 determines whether or not the operating state of the storage battery 3 has switched. Switching of the operating state of the storage battery 3 means that the operating state becomes a different operating state from the previous operating state. Switching of the operating state of the storage battery 3 includes changing from charging to discharging or retaining, changing from discharging to retaining or charging, and changing from retaining to charging or discharging. When the operating state of the storage battery 3 has switched (Yes in Step S4), the controller 71 determines the range of variation of the charge level and estimates the degree of degradation of the storage battery 3.

Even if the operating state of the storage battery 3 has not switched (No in Step S4), the controller 71 determines in Step S5 whether or not the prescribed time has elapsed. When the prescribed time has elapsed (Yes in Step S5), the controller 71 determines the range of variation of the charge level and estimates the degree of degradation of the storage battery 3. However, when the prescribed time has not elapsed (No in Step S5), the controller 71 returns to the processing of Step S2.

When the controller 71 determines that the operating state of the storage battery 3 has switched (Yes in Step S4) or determines that the prescribed time has elapsed (Yes in Step S5), the date and time at the time of the determination are stored in the storage unit 73 as the end date and time of the target period and the start date and time of the next target period.

The times $t_1$, $t_2$, $t_3$, $t_4$, $t_5$, $t_6$, . . . , and $t_k$ in the example in FIG. 4 correspond to the timings of switching of the operating state of the storage battery 3. The controller 71 divides the target period at the times $t_1$, $t_2$, $t_3$, $t_4$, $t_5$, $t_6$, . . . , and $t_k$, where the operating state of the storage battery 3 is switched. For example, for the time $t_3$, the controller 71 determines the range of variation of the charge level and estimates the degree of degradation of the storage battery 3 for a target period with the time $t_2$ as the start date and time and the time $t_3$ as the end date and time. Furthermore, for example, for the time $t_4$, the controller 71 determines the range of variation of the charge level and estimates the degree of degradation of the storage battery 3 for a target period with the time $t_3$ as the start date and time and the time $t_4$ as the end date and time. In this embodiment, the controller 71 estimates the degree of degradation of the storage battery 3 in the target periods, which are divided by the switching of the operating state of the storage battery 3 or at prescribed times. Compared to a method in which target periods are divided at timings where storage battery 3 is fully charged, for example, the storage battery management device 7 and the storage battery system 1 according to this embodiment can improve estimation accuracy of the degree of degradation of the storage battery 3 due to the estimation of the degree of degradation of storage battery 3 being performed over relatively short target periods.

Referring once again to FIG. 2, in Step S6, the controller 71 determines the range of variation of the charge level of the storage battery 3 during the target period.

Specifically, the controller 71 determines the range of variation of the charge level of the storage battery 3 during the target period based on the charge level included in information acquired during the target period, which is stored in the storage unit 73. The controller 71 extracts the maximum value and the minimum value from the charge level acquired in the target period and sets the range of variation of the charge level as being from the minimum value to the maximum value.

The controller 71 stores multiple operation modes having different SOC ranges in the storage unit 73 in advance, as illustrated in FIG. 6. In the example in FIG. 6, multiple operation modes (operation modes 1 to 6) corresponding to operating modes and multiple operation modes (operation modes 7 to 11) corresponding to retaining modes are stored in the storage unit 73. The controller 71 selects one operation mode so that the range of variation of the charge level based on the maximum value and the minimum value extracted in the target period is included in the SOC range of the operation mode. The controller 71 may store the selected one operation mode in the storage unit 73 in association with the target period.

For example, at the time $t_1$ in FIG. 4, the charge level has dropped from 100% to around 50%, and the controller 71 selects operation mode 2 in which the SOC range is set to 40 to 100 [%], as illustrated in FIG. 5. As illustrated in FIG. 6, operation mode 2 is one of multiple operation modes corresponding to operating modes, and defines an index and coefficients used to calculate normal degradation. For example, at the time $t_2$ in FIG. 4, the charge level remains at around 50% and does not change substantially, and the controller 71 selects operation mode 9, in which the SOC range is 30 to 70 [%], as illustrated in FIG. 5. As illustrated in FIG. 6, operation mode 9 is one of multiple operation modes corresponding to retaining modes, and defines an index and coefficients used to calculate retention degradation. For example, at the time $t_5$ in FIG. 4, the charge level has risen from 10% to around 80%, and the controller 71 selects operation mode 1 in which the SOC range is set to 10 to 100 [%], as illustrated in FIG. 5. As illustrated in FIG. 6, operation mode 1 is one of multiple operation modes corresponding to operating modes, and defines an index and coefficients used to calculate normal degradation.

In general, degradation of the storage battery 3 is known to progress more greatly when the storage battery 3 is operating or retaining power with the charge level near the end of discharging or near the end of charging than would otherwise be the case. Therefore, in this embodiment, as illustrated in FIG. 6, multiple operation modes are defined in accordance with the range of variation of the charge level, and an index and coefficients used to calculate the degree of degradation are defined. In other words, information on the correspondence between the conditions of the operation modes and the degrees of degradation of the storage battery 3 when the storage battery 3 is operated under those conditions is stored in the storage unit 73 in the form of a table as illustrated in FIG. 6. By using multiple operation modes divided into different patterns in this manner, the controller 71 can increase the accuracy with which the degree of degradation of the storage battery 3 is calculated. The number of operation modes and the SOC ranges of the operation modes are not limited to those given in the example in FIG. 6, and may be defined in any manner in accordance with the characteristics of the storage battery 3. Rate-dependent degradation may be calculated in addition to normal degradation when the operating state is charging, as illustrated in the "applicable category" section at the time $t_5$ and the time $t_k$ in FIG. 5. The rate-dependent degradation will be described in detail later.

Referring once again to FIG. 2, in Step S7, the controller 71 estimates the degree of degradation of the storage battery 3 during the target period.

Specifically, the controller 71 estimates the degree of degradation of the storage battery 3 during the target period based on the operation mode of storage battery 3 during the target period stored in the storage unit 73 and the temperature included in the information acquired during the target period.

In this embodiment, the controller 71 calculates the following Equation (1) based on Arrhenius' law and uses the calculation result to estimate the degree of degradation of the storage battery 3. Arrhenius' law is a well-known law used when, for example, predicting the temperature dependence of chemical reaction rates.

$$\alpha = \exp((b/T) + c) \tag{1}$$

Here,

α: reaction rate constant, b: slope, c: intercept, and

T: absolute temperature

The coefficient b, which represents the slope, and the coefficient c, which represents the intercept, are defined for each operation mode as illustrated in FIG. 6.

Using the reaction rate constant α calculated in Equation (1), the capacity degradation of the storage battery 3 is expressed by the following Equation (2).

$$CAP = \alpha(t)^{\beta} \tag{2}$$

Here,

CAP: capacity degradation,

α: reaction rate constant, t: elapsed time, and

β: degradation index.

In Equation (2), if the capacity degradation at a certain elapsed time t is $CAP_{(n-1)}$ and the capacity degradation at an elapsed time t+Δt, at which a time interval Δt has further elapsed from the elapsed time t, is $CAP_n$, the capacity degradation $CAP_{(n-1)}$ and $CAP_n$ are expressed by the following Equations (3) and (4), respectively. Using the capacity degradation $CAP_n$, the degree of degradation $SOH_{(n-1)}$ of the storage battery 3 at the elapsed time t and the degree of degradation $SOH_n$ at the elapsed time t+Δt satisfy the following relationships. In other words, the degree of degradation $SOH_n$ of the storage battery 3 can be calculated from the degree of degradation $SOH_{(n-1)}$ and the capacity degradation $CAP_n$.

$$CAP_{(n-1)} = \alpha(t)^{\beta} \tag{3}$$

$$CAP_n = \alpha(t+\Delta t)^{\beta} \tag{4}$$

$$SOH_n = SOH_{(n-1)} - CAP_n$$

From Equations (3) and (4), based on the capacity degradation $CAP_{(n-1)}$ at a certain point in time, the $CAP_n$ after a time Δt has elapsed from that point in time can be expressed by the following Equation (5).

$$CAP_n = \alpha\left((CAP_{(n-1)})^{\beta} + \Delta t\right)^{(1/\beta)} = f(CAP_{(n-1)}) \tag{5}$$

Here,

α: reaction rate constant,

β: degradation index,

Δt: time interval, and n: a natural number greater than or equal to 1.

The reaction rate constant α and the degradation index β in Equation (5) depend on the state in which the storage battery 3 is charging, discharging or retaining power, the charge level of the storage battery 3, the temperature of the storage battery 3, and so on. Therefore, in this embodiment, the coefficients and index are determined and stored in advance based on the degree of degradation of the storage battery 3, which is measured by operating the storage battery 3 while changing the conditions of the charge level, the temperature, and the operation mode of the storage battery 3. The pre-determined coefficients and index are, specifically, the coefficients (b, c) of the reaction rate constant α and the degradation index β, which are associated with each of the multiple operation modes illustrated in FIG. 6.

Based on the operation mode and temperature, the controller 71 estimates the degree of degradation of the storage battery 3 during the target periods by referring to the corresponding information.

Referring to FIG. 3, details of the estimation processing for estimating the degree of degradation of the storage battery 3 during each target period, which is performed by controller 71, will be described. For example, let us assume that the temperatures and current values of X storage batteries 3 are acquired at time intervals Δt during the target period. In Step S11, the controller 71 sets the initial value of the degree of degradation of the storage battery 3 acquired in Step S1 as $SOH_0$ and sets 0 as the initial value of the number of iterations n.

Next, the controller 71 repeats the processing from Step S12 to Step S17 X times. That is, the controller 71 performs the processing from Step S12 to Step S17 for all of the temperatures and current values of the X storage batteries 3 acquired in the target period. In this way, the controller 71 can calculate the degree of degradation $SOH_n$ of the storage battery 3 at a time point n (n is a natural number from 1 to X) for each time interval Δt from the degree of degradation $SOH_0$ of the storage battery 3 at the first starting point in the target period.

Specifically, in Step S12, the controller 71 increments the number of repetitions n by 1.

In Step S13, the controller 71 calculates the $SOH_n$ at the time point at which the time Δt×n has elapsed as described above using the coefficients of the selected operation mode. The $SOH_n$ calculated in Step S13 corresponds to the degree of degradation of normal degradation or retention degradation. For example, when multiple temperatures of multiple cells 31 are available, the largest temperature is selected and used as the temperature used in the calculation of the degree of degradation for normal degradation or retention degradation rather than averaging these temperatures. By selecting and using the largest temperature from among the multiple temperatures of the multiple cells 31, the degree of degradation $SOH_n$ of the storage battery 3 can be calculated more precisely.

Here, degradation of the storage battery 3 is known to progress in accordance with the rate and temperature in the case of charging. Therefore, the controller 71 determines whether the operating state is charging in Step S14 and whether the average current value is greater than or equal to a threshold in Step S15. The threshold in Step S15 is a reference value for determining that more current than usual is flowing due to the progression of degradation, and is set in accordance with the type of the storage battery 3 and so on. For example, when multiple currents are obtained, in Step S15, the multiple currents are averaged and the average value is compared to the threshold.

The controller 71 calculates the rate-dependent degree of degradation when the operating state is charging (Yes in Step S14) and the average current value is greater than or equal to the threshold (Yes in Step S15). The rate-dependent degree of degradation is a degree of degradation corresponding to advanced degradation, and is a value that modifies the normal degree of degradation. The controller 71 can calculate the degree of degradation $SOH_n$ of the storage battery 3 with high accuracy by including temperature-dependent changes caused by rate-dependent degradation. FIG. 7 illustrates a table of coefficients and other factors for determining the amount of change with temperature due to rate-dependent degradation in this embodiment. Based on the operation mode and temperature, the controller 71 extracts the reaction rate constant α and the degradation index β from FIG. 7 and calculates the rate-dependent degree of degradation of the storage battery 3 in accordance with Equation (2). Here, in the rate-dependent degree of degradation, the rated capacity is also varied in accordance with the operation mode, and the calculated value according to Equation (2) is adjusted in accordance with a multiplier (0.932 for example in operation mode 1) as illustrated in FIG. 7. The rated capacity corresponds to the design capacity described above in the calculation of the degree of degradation. If multiple temperatures of multiple cells 31 are available, for example, the smallest temperature is selected and used as the temperature used in the calculation of the rate-dependent degree of degradation rather than averaging these temperatures. By selecting and using the smallest temperature from among the multiple temperatures of the multiple cells 31, the rate-dependent degree of degradation of the storage battery 3 can be calculated more precisely.

Referring once again to FIG. 3, the controller 71 calculates the rate-dependent degree of degradation in Step S16 and adds the calculated rate-dependent degree of degradation to the degree of degradation $SOH_n$ for normal degradation. The final degree of degradation is obtained after this addition. Here, if the operating state is not charging (No in Step S14), the rate-dependent degree of degradation is not calculated, and the degree of degradation $SOH_n$ for normal degradation is the final degree of degradation. Even when the operating state is charging, if the average current value is less than the threshold (No in Step S15), the rate-dependent degree of degradation is not calculated and the degree of degradation $SOH_n$ for normal degradation is the final degree of degradation. The controller 71 stores the final degree of degradation $SOH_n$ in the storage unit 73 as the degree of degradation of the storage battery 3 at time point n.

In Step S17, the controller 71 determines whether or not the estimation processing of the degree of degradation from Step S12 to Step S17 has been repeated X times. If the estimation processing of the degree of degradation is determined to not have been repeated X times (No in Step S17), the controller 71 repeats the processing from Step S12. On the other hand, if the estimation processing of the degree of degradation is determined to have been repeated X times (Yes in Step S17), the controller 71 stores the degree of degradation $SOH_X$ of the storage battery 3 at time point X in the storage unit 73 as the degree of degradation of the storage battery 3 at the end of the target period. The controller 71 may output the estimated degree of degradation of the storage battery 3 to the output unit 74.

Referring to FIG. 2 once again, once Step S7 is completed, the controller 71 terminates this processing. After completing this processing, the controller 71 may start the processing again from Step S1.

As described above, in this embodiment, the storage battery management device, the storage battery system, and the storage battery management method can estimate the degree of degradation of storage batteries with high accuracy via the above configurations and processes.

An embodiment of the present disclosure has been described based on the drawings and examples, but note that a variety of variations and amendments may be easily made by one skilled in the art based on the present disclosure. Therefore, note that such variations and amendments are included within the scope of the present disclosure. For example, the functions and so forth included in each component or step can be rearranged in a logically consistent manner, and a plurality of components or steps can be combined into a single component or step or a single component or step can be divided into a plurality of components or steps. The embodiment of the present disclosure can also be realized as a program executed by a processor included in a device or as a storage medium on which the program is recorded. Please understand that the scope of the present disclosure also encompasses these forms.

For example, in the embodiment described above, the storage battery system 1 is described as including one of each of the current sensor 4, the temperature sensor 5, and the voltage sensor 6, but the storage battery system 1 is not limited to this configuration. The storage battery system 1 may include multiple current sensors 4, multiple temperature sensors 5, or multiple voltage sensors 6. For example, in the storage battery system 1, the current sensor 4, the temperature sensor 5, or the voltage sensor 6 does not need to be provided for each storage battery 3, and may instead be provided for each cell 31 or for each storage battery module 32. In such a case, the storage battery management device 7 may calculate the current, temperature, or voltage of the storage battery 3 by calculating an average value or representative value from the values measured by multiple current sensors 4, multiple temperature sensors 5, or multiple voltage sensors 6.

Alternatively, all or some of the functions or processing described as the functions or processing of the storage battery management device 7 in the embodiment described above may be realized as the functions or processing of a computer, such as a smart phone or personal computer. Specifically, a program describing processing content that realizes each function of the storage battery management device 7 according to this embodiment is stored in the memory of a computer, and the program is read out and executed by a processor of the computer. Therefore, the processing of the storage battery management device 7 according to this embodiment can also be realized as a program that can be executed by a processor.

Alternatively, in the embodiment described above, an example in which the storage battery management device 7 is provided so as to be separate from the power conditioner 2 and the storage battery 3 is illustrated, but this does not need to be the case. The power conditioner 2 or the storage battery 3 may function as the storage battery management device 7. Alternatively, an EMS (energy management system) such as a HEMS (home energy management system) and a BEMS (building energy management system) may function as the storage battery management device 7. In such cases, the power conditioner 2, the storage battery 3, or the EMS may be configured to include a computer having the configurations and functions described above as the configurations and functions of the storage battery management device 7.

The invention claimed is:

1. A storage battery management device, comprising:
- a controller configured to
  - acquire a current value flowing in a storage battery, a temperature of the storage battery, and a charge level of the storage battery in a target period,
  - determine an operation mode of the storage battery in the target period based on the current value and the charge level,
  - divide the target period into sections at a timing at which the storage battery is switched from one operating state to another operating state among a plurality of operating states, the plurality of operating states including charging, discharging, and retaining, and
  - estimate a degree of degradation of the storage battery in each of the sections of the target period based on the operation mode and the temperature.

2. The storage battery management device according to claim 1, further comprising:
- a storage unit configured to store correspondence information on a correspondence between a condition of an operation mode in which the storage battery is operated and a degree of degradation of the storage battery when the storage battery is operated under the condition,
- wherein the controller is configured to estimate a degree of degradation of the storage battery in the target period based on the correspondence information.

3. The storage battery management device according to claim 1, wherein the controller is configured to determine, in determining the operation mode, whether the operation mode is an operating mode in which charging or discharging is performed or a retaining mode in which power is retained.

4. The storage battery management device according to claim 1, wherein the controller is configured to determine a variation range of the charge level of the storage battery in the target period in determining the operation mode.

5. The storage battery management device according to claim 1, wherein the controller is configured to, in response to determining that an operating state of the storage battery is charging, add an amount of change corresponding to the temperature in of estimating the degree of degradation.

6. The storage battery management device according to claim 1, wherein the controller is configured to, in response to determining that an operating state of the storage battery is charging, change a rated capacity in accordance with the operation mode in estimating the degree of degradation.

7. A storage battery system, comprising:
- a storage battery and a storage battery management device including a controller, wherein the controller is configured to
  - acquire a current value flowing in the storage battery, a temperature of the storage battery, and a charge level of the storage battery in a target period,
  - determine an operation mode of the storage battery in the target period based on the current value and the charge level,
  - divide the target period into sections at a timing at which the storage battery is switched from one operating state to another operating state among a plurality of operating states, the plurality of operating states including charging, discharging, and retaining, and
  - estimate a degree of degradation of the storage battery in each of the sections of the target period based on the operation mode and the temperature.

8. A storage battery management method to be performed by a storage battery management device including a controller, the method comprising:
- acquiring, by the controller, a current value flowing in the storage battery, a temperature of the storage battery, and a charge level of the storage battery in a target period;
- determining, by the controller, an operation mode of the storage battery in the target period based on the current value and the charge level;
- dividing, by the controller, the target period into sections at a timing at which the storage battery is switched from one operating state to another operating state among a plurality of operating states, the plurality of operating states including charging, discharging, and retaining; and estimating, by the controller, a degree of degradation of the storage battery in each of the sections of the target period based on the operation mode and the temperature.

* * * * *